(12) United States Patent
Pilling

(10) Patent No.: US 8,041,552 B2
(45) Date of Patent: Oct. 18, 2011

(54) BEHAVIORAL MODELING OF HIGH SPEED DIFFERENTIAL SIGNALS BASED ON PHYSICAL CHARACTERISTICS

(75) Inventor: David J. Pilling, Los Altos Hills, CA (US)

(73) Assignee: Intergrated Device Technology, Inc., San Jose, CA (US)

( * ) Notice: Subject to any disclaimer, the term of this patent is extended or adjusted under 35 U.S.C. 154(b) by 575 days.

(21) Appl. No.: 11/786,175

(22) Filed: Apr. 10, 2007

(65) Prior Publication Data

US 2008/0255820 A1 Oct. 16, 2008

(51) Int. Cl.
*G06F 17/50* (2006.01)
(52) U.S. Cl. .......................................... 703/14
(58) Field of Classification Search .................. 702/124; 703/14
See application file for complete search history.

(56) References Cited

U.S. PATENT DOCUMENTS

| | | | | |
|---|---|---|---|---|
| 5,113,144 A * | 5/1992 | Song | | 330/85 |
| 5,349,539 A * | 9/1994 | Moriyasu | | 703/15 |
| 5,467,291 A * | 11/1995 | Fan et al. | | 703/14 |
| 5,801,550 A * | 9/1998 | Tanaka et al. | | 326/87 |
| 5,945,877 A * | 8/1999 | Elango et al. | | 330/156 |
| 6,018,450 A * | 1/2000 | Ahmad et al. | | 361/90 |
| 6,353,343 B1 * | 3/2002 | Payne et al. | | 327/52 |
| 6,535,534 B1 * | 3/2003 | Fischer | | 372/38.07 |
| 6,624,670 B2 * | 9/2003 | Payne et al. | | 327/108 |
| 6,775,646 B1 * | 8/2004 | Tufillaro et al. | | 703/2 |
| 7,091,754 B2 * | 8/2006 | Lu et al. | | 327/108 |
| 7,191,371 B2 * | 3/2007 | Hsu et al. | | 714/717 |
| 7,248,636 B2 * | 7/2007 | Martinez | | 375/257 |
| 7,295,961 B2 * | 11/2007 | Root et al. | | 703/14 |
| 7,437,500 B2 * | 10/2008 | Butt et al. | | 711/105 |
| 7,706,487 B2 * | 4/2010 | Aziz et al. | | 375/350 |

OTHER PUBLICATIONS

BJT Characteristics and Amplifiers. Beckler, Matthew. [online] Apr. 2, 2006 [Retrieved on Sep. 17, 2009] <URL:http://www.mbeckler.org/coursework/2005-2006/ee2002lab6.pdf>.*
Integrating Amplifier—An Application of Capacitor. Lai, Thao. [online] Apr. 13, 2004 [Retrieved on Sep. 17, 2009] <URL:http://www.eod.gvsu.edu/~lait/214/intamplifier.pdf>.*
An Efficient Bottom Up Extraction Approach to Build Accurate PLL Behavioral Models for SOC Designs. Kuo, Chin Cheng. Wang, Yu-Chien. Jimmy Liu, Chien-Nan. [online] Retrived from ACM Database. Apr. 17-19, 2005. [Retrieved Sep. 18, 2009].*
Clamp Voltage Analysis for RCD Forward Converters. Bridge, Christopher. [online]. Retrieved from IEEE Database. 2000 [Retrieved Sep. 16, 2009].*
MacroModeling C- and RC-Loaded CMOS Inverters for Timing Analysis. Kayssi, Ayman. [online] Retrived from IEEE database. 1996 [Retrieved on Sep. 17, 2009].*
Printed Circuitt Board Simulation: A Look at Next Generation Simulation Tools and Their Correlation to Laboratory Measurements. Aziz, Shahana. [online] Sep. 8-10, 2004. [Retrieved on Sep. 16, 2009]. <URL:klabs.org/mapld04/abstracts/aziz_a.doc >.*

(Continued)

*Primary Examiner* — Hugh Jones
(74) *Attorney, Agent, or Firm* — Hayes and Boone LLP

(57) ABSTRACT

A method of modeling the output drivers in an integrated circuit, for example a serializer/deserializer circuit, is provided. In accordance with embodiments of the invention, at least one parameter of the circuit is physically measured and a behavioral model utilizing that parameter is constructed. The behavioral model can then be utilized to predict the behavior of the integrated circuit output drivers.

7 Claims, 3 Drawing Sheets

OTHER PUBLICATIONS

Temperature Dependent Dynamic Triggering Characteristics of SCR-type ESD protection circuits. Sheng-Lyang, Jang. Lien-SHeng, Lin. Shao-Hua, Li. [online] May 30, 2001.[Retrieved on Sep. 16, 2009] Retrieved from Elsevier Science Database.*

Spice Parameter Extraction From Automated Measurement of JFET and MOSFET Characteristics in the Computer Integrated Electronics Laboratory. Guvenich, Mustafa.[online] 1994. [Retrieved on Sep. 17, 2009]. <URL:http://eelinux.ee.usm.maine.edu/courses/ele343/343%20Class%20Notes-Handouts/Lab%20Handouts/ASEE94FIN.pdf>.*

Hogan; Advanced modeling verifies backplane designs; EE Times, Aug. 2005; pp. 1-7.*

Mutnury; Macromodeling of Nonlinear Driver and Receiver Circuits, PH D Thesis, Georgia Institute of Technology; Dec. 2005; pp. 1-194.*

Telian; New IBIS Techniques for Modeling Complex IO; Cadence Webinar; pp. 1-33, Mar. 2005.*

* cited by examiner

BEHAVIORAL MODELING OF HIGH SPEED DIFFERENTIAL SIGNALS BASED ON PHYSICAL CHARACTERISTICS

BACKGROUND

1. Field of the Invention

The present invention relates to modeling of the output drivers and, in particular, to modeling of the high-speed differential signals generated by the output drivers.

2. Discussion of Related Art

Modeling of circuits has been a staple of use for designing integrated circuits for quite some time. One such modeling software, SPICE, has been in use for nearly 40 years. The SPICE simulation models, such as IBIS, provide reasonable accuracy for applications of frequencies less than 200 MHz. The IBIS model is generated from SPICE models of the designed circuits and consist of I-V (Current-Voltage) response tables. The accuracy of these tables is defined by the current-voltage increment steps, usually about 100 mV.

However, in serializer/deserializer (SERDES) circuits, frequencies of above 1 GHz are commonly encountered. With frequencies above about 1 GHz, if the current-voltage increment is reduced to 4 mV, the I-V data generated by the IBIS model is a single-spaced table of data that is about 34 pages long. The limitation of the IBIS model is not only the size of the look-up table generated, but that the table is generated from a SPICE model designed for the circuit under test. The accuracy of the data in the table is therefore not as high as needed to provide acceptable prediction results for the circuit under test.

Therefore, there is a need for an ability to model the high-speed differential output of integrated circuits with specific accuracy of the device under test.

SUMMARY

In accordance with some embodiments of the present invention, a method of modeling an output driver circuit includes physically measuring at least one characteristic of the actual output driver circuit; and using the at least one characteristic to determine a parameter in a behavioral model in order to predict a behavior of the output driver circuit.

In some embodiments, a characteristic is a resistance of a pull-up resistor and the at least one parameter is the resistance of the pull-up resistor. In some embodiments, a characteristic is a current of a current source and the at least one parameter is the current of the current source. In some embodiments, a characteristic is the overshoots and undershoots in an output waveform and the at least one parameter includes transistor values fit to the measured overshoots and undershoots in the output waveform.

In some embodiments, the at least one characteristic is an output waveform under a set load. In some embodiments, the at least one parameter is a clamping voltage. In some embodiments, the at least one parameter is a transistor strength.

In some embodiments, the behavioral model includes a voltage controlled voltage source section; a capacitively loaded inverter section coupled to receive signals from the voltage controlled voltage source section; a differential pre-amplifier section coupled to receive signals from the capacitively loaded inverter section; a main differential driver coupled to receive signals from the differential pre-amplifier section; and an emphasis driver coupled to receive signals from the differential pre-amplifier section and the main differential driver, wherein the at least one parameter determines a characteristic of the behavioral model.

These and other embodiments are further discussed below with respect to the following figures.

In the figures, elements having the same designation have the same or similar functions.

DETAILED DESCRIPTION

Embodiments of the present invention provide a behavioral model for high speed differential signals produced by a circuit under test that is based on the actual physical characterization of the output drivers in the circuit under test. In some embodiments, the method of modeling helps create SPICE models to simulate high speed differential signals such as those employed in serial interface circuits (SERDES circuits).

Figure 1:
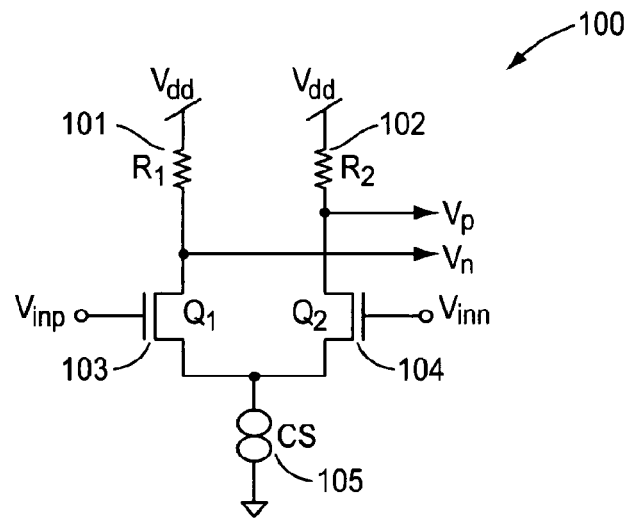
FIG. 1 shows an example differential amplifier.

FIG. 1 shows a circuit diagram for an example differential amplifier 100. Differential driver 100 includes a first transistor 103 coupled in series with a pull-up resistor 101 between a current source 105 and a power voltage Vdd, and a second transistor 104 coupled in series with a pull-up resistor 102 between current source 105 and power voltage Vdd. Current source 105 is coupled between transistors 103 and 104 and ground. The differential input signal, $Vin_p$ and $Vin_n$, is coupled to the gates of transistors 103 and 104, respectively. The output signal, Vp an Vn, is taken from the nodes between resistor 102 and transistor 104, and resistor 101 an transistor 103, respectively.

Figure 2:
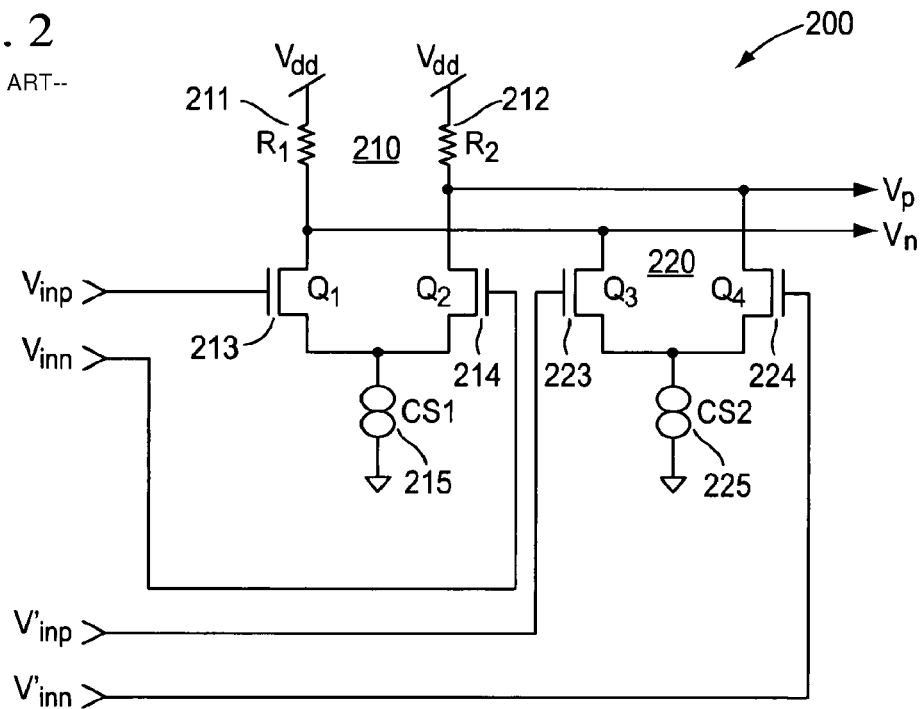
FIG. 2 shows an example differential amplifier with emphasis.

FIG. 2 illustrates a differential transmit driver 200 with emphasis. As shown in FIG. 2, differential driver 200 includes a main driver 210 and an emphasis driver 220, both of which utilize the same pair of pull-up resistors 211 and 212. As shown in FIG. 2, main driver 210 includes transistor 213 coupled in series with pull-up resistor 211 between power voltage Vdd and current source 215, and transistor 214 coupled in series with pull-up resistor 212 between power voltage Vdd and current source 215. Current source 215 is coupled between transistors 213 and 214 and ground. The input signal $Vin_p$ and $Vin_n$ is coupled to the gates of transistor 213 and 214, respectively.

Emphasis driver 220 includes transistor 223 coupled in series with pull-up resistor 211 between power voltage Vdd and current source 225, and transistor 224 coupled in series with pull-up resistor 212 between power voltage Vdd and current source 225. Current source 225 is coupled between transistors 223 and 224 and ground. The gates of transistors 223 and 224 are coupled to emphasis input signal $V'in_p$ and $V'in_n$, respectively.

Of course, high-speed output driver circuits are not as simple as depicted in FIGS. 1 and 2. An array of additional circuitry and initial drivers are often utilized in forming and outputting the differential signal from an integrated circuit. For example, an output driver may include electrostatic discharge (ESD) protection devices, power shut-off devices, wave-shaping circuitry, and other circuitry.

Figure 3:
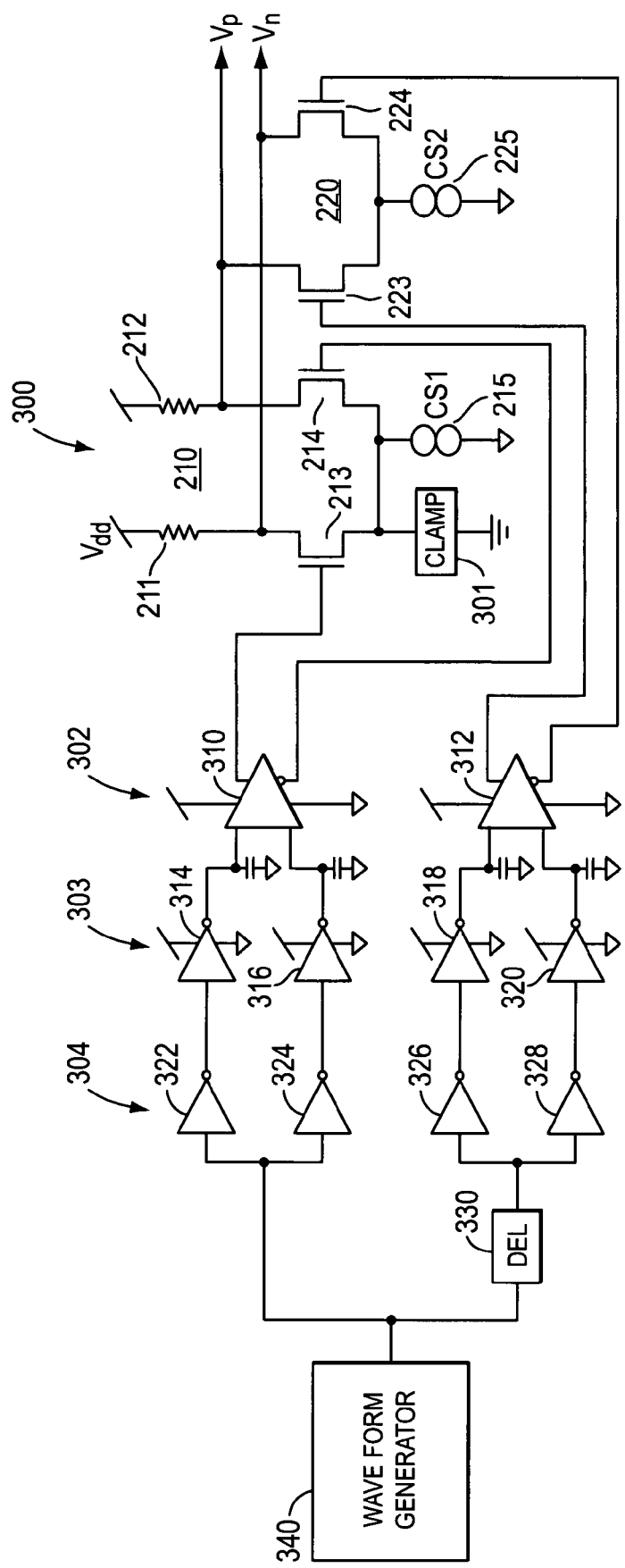
FIG. 3 illustrates a behavioral model with transistor drivers according to some embodiments of the present invention.

FIG. 3 illustrates a model 300 that is applicable to most, if not all, differential output circuitry. Model 300 can be utilized to predict the results of an actual circuit under test. Additionally, the circuit in model 300 is easily modeled in SPICE, avoiding problematic conversion problems associated with modeling the actual driver circuit under test.

As shown in FIG. 3, model 300 includes main driver 210 and emphasis driver 220 as described in FIG. 2. The input signals to main driver 210 and emphasis driver 220 are generated in differential pre-amplifiers 310 and 312, respectively, of differential pre-amplifier stage 310. In turn, the input signals to pre-amplifiers 310 and 312 are driven by capacitivly loaded inverters 314, 316, 318, and 320 of inverter stage 303. Inverters 314 and 316 provide input signals to differential pre-amplifier 310, which drives main driver 210. Inverters 318 and 320 provide input signals to differential pre-amplifier 312, which drives emphasis driver 220. The input signals to capacitivly loaded inverters 314, 316, 318, and 320 are provided by voltage controlled voltage sources 322, 324, 326, and 328, respectively, of voltage controlled sources stage 300. Waveform generator 340 can be utilized to provide a signal to voltage controlled sources 322 and 324 and, through delay element 330, to voltage controlled sources 326 and 328. Further, model 300 includes a clamp 301 across current source 215 to model clamping seen on output waveforms of the circuit under test.

Voltage generator 340 can be a linear piecewise voltage source that supplies an input clock waveform, which is delayed by, for example, one clock cycle, in delay element 330. The clock and the delayed clock waveforms are buffered by voltage controlled voltage sources 322, 324, 326, and 328, which act as voltage sources to transistor based capacitivly loaded inverters 314, 316, 318, and 320. Inverters 314, 316, 318, and 320 drive two differential stages, main driver 210 and emphasis driver 220. Many of the features of the circuit can be measured directly from static features of the circuit.

The resistance of pull-up resistors 211 and 212 of the differential stage, main driver 210 and emphasis driver 220, can be measured from the actual driver circuit that is being modeled with an ohm meter. During the resistance measurement, power supply Vdd is turned off and the supply grounded. The resistance of resistors 211 and 212 is nominally 50 ohms for a 100 ohm differential line impedance. However, the load resistor can vary as much as 20% before on-chip calibration. Calibration procedures can reduce this value to better than about 3%.

The current supplied by current source 215 can be calculated from the voltage drop across pull-up resistors 211 and 212 with the emphasis current source programmed "off," i.e. emphasis driver 220 off. The current supplied by current source 225 can be measured from the difference in the I-R drop across pull-up resistors 211 and 212 recorded with and without emphasis (i.e., with emphasis driver 220 on and with emphasis driver 220 off). The current supplied by current source 215, for example, can be measured by measuring the voltage across pull-up resistor 211 with transistor 214 off, transistor 213 on, and emphasis driver off. The current is then calculated by dividing the measured voltage by the measured resistance of resistor 211. The current supplied by current source 225 can be determined by measuring the voltage across resistor 211 with transistors 213 and 214, transistor 223 off, and transistor 224 on. One skilled in the art will recognize from this example several methods that can be utilized to determine the current supplied by current sources 215 and 225.

The remaining parameters in model 300, such as, for example, the clamping voltage of clamp 301, the characteristics of differential amplifier section 302, the characteristics of inverter section 303, and the characteristics of voltage controlled sources 314, can be fit to measurements of waveforms of the circuits under test compared to predicted waveforms from model 300 under specified load conditions. The waveforms from the actual circuit under test with set loads can be measured and the parameters of model 300 adjusted until the model predicts the output signal of the actual circuit. The output waveforms will exhibit, for example, overshoot characteristics, clipping, and other waveform shapes that can be fit to the parameters of model 300. For example, observed clipping in the output waveform can be fit by adjusting the characteristics of clamp 301.

The accuracy of the behavioral model is improved by adjusting the fractional values of main driver 210 and emphasis driver 220 current sources to the published data sheet values. The shape of the clocked signals, i.e. the rise and fall times of the output waveforms, can be adjusted if the load board parameters are extracted and submitted to the behavioral model by adjusting the parameters of the transistors of the predrivers and output drivers.

Figure 4:
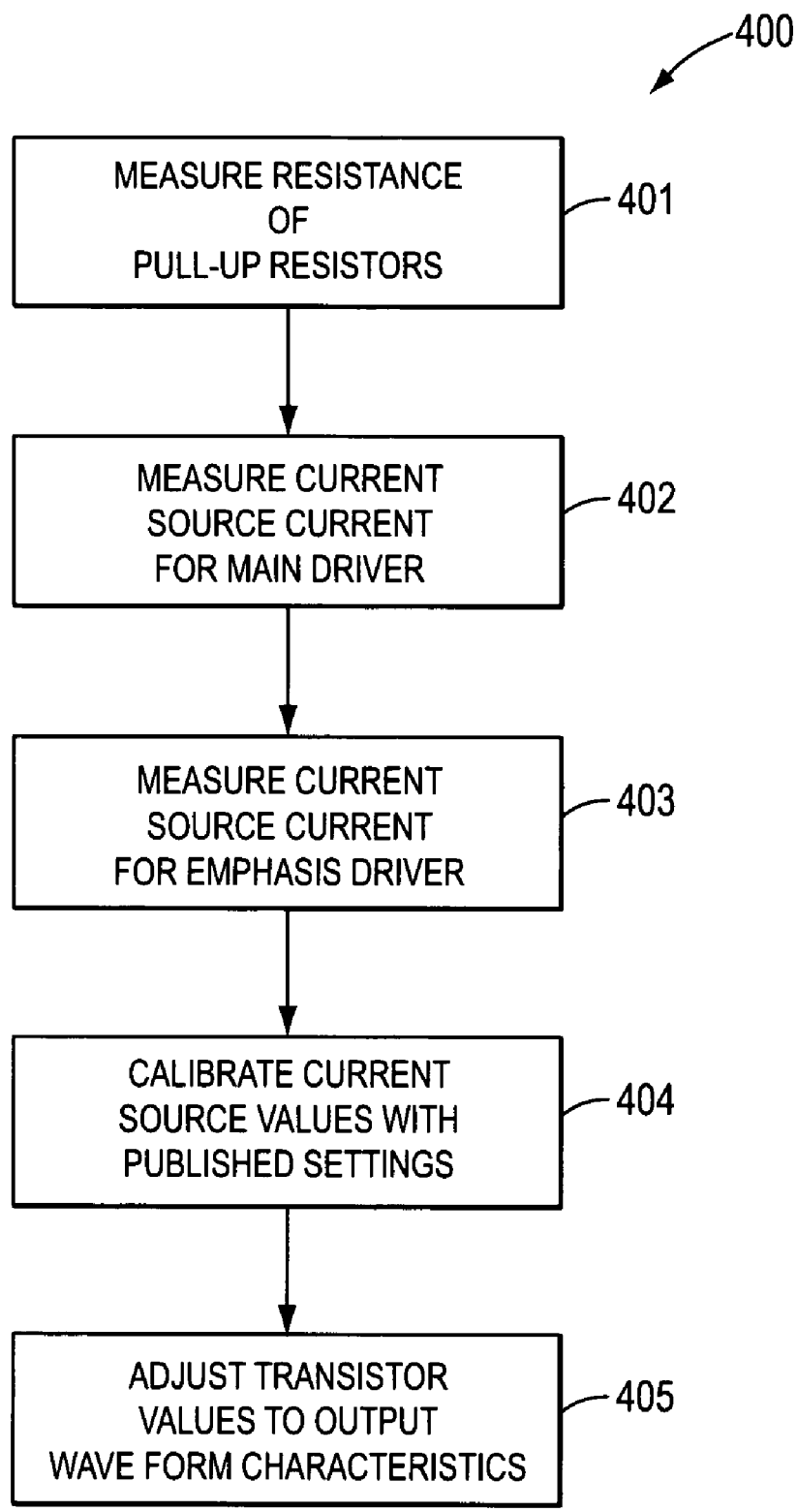
FIG. 4 illustrates a method of obtaining parameters for the behavioral model according to embodiments of the present invention.

FIG. 4 illustrates the method of obtaining a behavioral model for a particular output drive circuit. As shown in FIG. 4, in step 401 the resistance values of pull-up resistors 211 and 212 are obtained. As discussed above, the resistance values can be simply measured with an ordinary ohm-meter with power Vdd off. In step 402, the current of current source 215 is measured by measuring the current through (i.e., voltage across) resistors 211 and 212 while emphasis driver 220 is turned off. In step 403 the current of current source 225 is measured by measuring the difference in currents through pull-up resistors 211 and 212 with emphasis driver 220 turned on. In step 404, the current source values for current source 215 and current source 225 are then calibrated with those values published for the actual driver circuit. Look-up tables can be utilized to adjust the published values of the parameters against those that are actually measured from the circuit under test.

In step 405, the output waveform is measured and parameters of the behavioral model illustrated in FIG. 3 are adjusted to fit the observed waveform. For example, the transistor values for the transistors in main driver 210, emphasis driver 220, and predrivers (which include differential pre-amplifiers 310 and 312, inverters 314, 316, 318, and 320, as well as voltage sources 322, 324, 326, and 328) can be adjusted to match the measured output rise and fall times and waveform overshoot characteristics for specific loads and return loss characteristics. Further, capacitance values of inverters 314, 316, 318, and 320 can be adjusted to help fit the measured output waveform.

When the behavioral model is completed, the current-voltage increment of the behavioral model is based on picosecond time increments and predicts the behavior of the actual circuit under test with far greater accuracy than the millivolt increments of the IBIS models.

Once completed, a full set of measured characteristic parameters for the behavioral model illustrated in FIG. 3 is developed. That model can then be utilized to predict the behavior of the output drivers in the particular target integrated circuit. Attached to this specification, and herein incorporated by reference in its entirety, is an example SPICE modeling utilizing the behavioral model shown in FIG. 3 to model an actual circuit. The comments on the side in the attached SPICE code illustrate the input of the various parameters that are physically measured as illustrated in FIG. 4.

The embodiments of the invention described herein are illustrative only and are not to be considered limiting. One skilled in the art may recognize features and additions of these embodiments that may be accomplished differently or additional features which may not be explicitly discussed here.

These features are also within the scope of this disclosure. As such, the invention is to be limited only by the following claims.

---

```
.global vdd vss period
*
*****************************************
*   PARAMETER AND OPTIONS
*****************************************
.options
+ ingold=0        acct
+ absmos=1e-9     abstol=1e-11   vntol=1e-7    dv=1.0
+ gmin=1e-14      relmos=0.01    absvar=0.05
+ chgtol=1e-14    cvtol=0.05     trtol=4.0
+ method=gear     nomod          co=80
+ captab          scale=1u       dccap
+ post_version=9007 CONVERGE=1
*****************************************
*   Power Supplies
*****************************************
vvtt       vtt       0     1.5v
vvdd       vdd       0     1.2v
vvss       vss       0     0v
vcsbias    csbias    0     0.5v
vpdb       pdb       0     0v
vhalfvdd   half_vdd  vss   0.6v
*****************************************
*   SIMULATION CONDITIONS
*****************************************
.temp      65
.param     period = 400ps
*****************************************
*   Circuits
*****************************************
*.inc  './inc/pattern.period_random'
.inc   './inc/pattern.uniform_250Mhz'   ◄   pattern generator
xpattern dout pattern period
*
emphasis emph vss VCVS DELAY dout vss TD='period/2'   ◄   delay element
*
cemph emph 0 0.1pf
*
xinv1 dr    outb   inv pw=32 nw=16
xinv2 drb   out    inv pw=32 nw=16
xinv3 em    oxb    inv pw=32 nw=16   ◄   inverter predriver
xinv4 emb   ox     inv pw=32 nw=16
*
e1 outb   half_vdd dout half_vdd −1
e2 out    half_vdd dout half_vdd  1
e3 oxb    half_vdd emph half_vdd  1  ◄  voltage controlled voltage source with thresholds at $V_{dd/2}$
e4 ox     half_vdd emph half_vdd −1
*
xteqbuf1 csbias drb dr on op         pdb XTEQBUFF4x
xteqbuf2 csbias emb em onm opm       pdb XTEQBUFF4x   ◄   differential driver
*
cdrb    drb   0 0.1pf
cdr     dr    0 0.1pf
cemb    emb   0 0.1pf  ◄   output waveform caps
cem     em    0 0.1pf
*
*   OUTPUT DRIVER WITH CS CURRENT SOURCES          ◄   output drivers
mq1 txn  op    cs1 vss nch w=200.0 l=0.13
mq2 txp  on    cs1 vss nch w=200.0 l=0.13
mq3 txp  onm   cs2 vss nch w=200.0 l=0.13
mq4 txn  opm   cs2 vss nch w=200.0 l=0.13
*                                    ◄   transistors & differential current source
ccs1 cs1 0 0.1pf                         with resistor loads
ccs2 cs2 0 0.1pf
*
rcom    vtt    com1    10
rvxn    com1   txn     40
rvxp    com1   txp     40
*
*.model spkg s tstonefile='./inc/Data_pair.s4p'
*****************************
*   S-parameter package model
*****************************
*s1 tn_pkg tp_pkg txp_r txn_r vss mname=spkg
```

```
********************
*   Ideal terminations
********************
*ctn_pkg tn_pkg rcvn 200n
*rcvnx rcvn 0   50
*ctp_pkg tp_pkg rcvp 200n
*rcvpx rcvp 0   50
*ctn_pgl tn_pkg 0   1pf
*ctp_pgl tp_pkg 0   1pf
********************
*
*   The G element is a Voltage Controlled Current Source (VCCS)
*   for the output driver, I_main & I_preemph
*   Typical default values of the transmit output driver are:
*
.param main_dr=23.3ma  ◄     Typical = 24 ma  Best Case = 28 ma  Worst Case = 20 ma
.param preemp=12.3ma   ◄     Typical = 15 ma  Best Case = 18 ma  Worst Case = 12 ma
Gdvr_cs1 cs1 vss CUR='main_dr*dtx'
Gdvr_cs2 cs2 vss CUR='preemp*deqx'
*
*   otherwise, substitute .param values as measured on component under
*   evaluation as described in README file.
*
*   Select "1" or "0" values for parameters dt3 dt2 dt1 dt0 based on
*   your evaluation of the pdf files included in the README file.
*
*   Replace the default values in the .param statement below with your
*   desired main drive value.
*
.param dt3=0     dt2=0    dt1=0     dt0=0
.param dt3b=1    dt2b=1   dt1b=1    dt0b=1    ◄     Main driver code for percent drive
*
*.param dtx=0.5
.param dtx_1='(1.06)*(dt3b)*(dt2b)*(dt1b)*(dt0b)'
.param dtx_2='(0.78)*(dt3b)*(dt2b)*(dt1b)*(dt0)'
.param dtx_3='(0.81)*(dt3b)*(dt2b)*(dt1)*(dt0b)'
.param dtx_4='(0.85)*(dt3b)*(dt2b)*(dt1)*(dt0)'
.param dtx_5='(0.89)*(dt3b)*(dt2)*(dt1b)*(dt0b)'
.param dtx_6='(0.93)*(dt3b)*(dt2)*(dt1b)*(dt0)'           ◄     Replace "IF/ELSE" code
.param dtx_7='(0.96)*(dt3b)*(dt2)*(dt1)*(dt0b)'
.param dtx_8='(1.00)*(dt3b)*(dt2)*(dt1)*(dt0)'
.param dtx_9='(0.44)*(dt3)*(dt2b)*(dt1b)*(dt0b)'
.param dtx_10='(0.48)*(dt3)*(dt2b)*(dt1b)*(dt0)'
.param dtx_11='(0.52)*(dt3)*(dt2b)*(dt1)*(dt0b)'
.param dtx_12='(0.56)*(dt3)*(dt2b)*(dt1)*(dt0)'
.param dtx_13='(0.59)*(dt3)*(dt2)*(dt1b)*(dt0b)'
.param dtx_14='(0.63)*(dt3)*(dt2)*(dt1b)*(dt0)'
.param dtx_15='(0.67)*(dt3)*(dt2)*(dt1)*(dt0b)'
.param dtx_16='(0 95)*(dt3)*(dt2)*(dt1)*(dt0)'
.param dtx='dtx_1+dtx_2+dtx_3+dtx_4+dtx_5+dtx_5+dtx_6+dtx_7+dtx_8+dtx_9+\\
        dtx_10+dtx_11+dtx_12+dtx_13+dtx_14+dtx_15+dtx_16'
*
*   Replace the default values in the .param statement below with your
*   desired preemphasis drive value.
*
*   Note that 'preemphasis' was originally termed 'deemphasis' so for a more
*   positive outlook, the parameter 'deqx' is obtained by subtracting the
*   fractional deempahesis from '1' to obtained a value for preemphasis.
*
.param deq=1      deq2=1    deq1=1     deq0=0
.param deq3b=0    deq2b=0   deq1b=0    deq0b=1   ◄     pre emphasis code
*
.param deqx='(1-deq)'
.param deq_1='(1.0)*(deq3b)*(deq2b)*(deq1b)*(deq0b)'
.param deq_2='(0.96)*(deq3b)*(deq2b)*(deq1b)*(deq0)'
.param deq_3='(0.92)*(deq3b)*(deq2b)*(deq1)*(deq0b)'
.param deq_4='(0.88)*(deq3b)*(deq2b)*(deq1)*(deq0)'
.param deq_5='(0.84)*(deq3b)*(deq2)*(deq1b)*(deq0b)'
.param deq_6='(0.80)*(deq3b)*(deq2)*(deq1b)*(deq0)'
.param deq_7='(0.76)*(deq3b)*(deq2)*(deq1)*(deq0b)'
.param deq_8='(0.72)*(deq3b)*(deq2)*(deq1)*(deq0)'        ◄     "IF/ELSE" selection
.param deq_9='(0.68)*(deq3)*(deq2b)*(deq1b)*(deq0b)'
.param deq_10='(0.64)*(deg3)*(deq2b)*(deq1b)*(deq0)'
.param deq_11='(0.60)*(deq3)*(deq2b)*(deq1)*(deq0b)'
.param deq_12='(0.56)*(deq3)*(deq2b)*(deq1)*(deq0)'
.param deq_13='(0.52)*(deq3)*(deq2)*(deq1b)*(deq0b)'
.param deq_14='(0.48)*(deq3)*(deq2)*(deq1b)*(deq0)'
.param deq_15='(0.44)*(deq3)*(deq2)*(deq1)*(deq0b)'
```

```
.param deq__16='(0.35)*(deq3)*(deq2)*(deq1)*(deq0)'
.param deq='deq__1+deq__2+deq__3+deq__4+deq__5+deq__6+deq__7+deq__8+deq__9+deq__10+\\
        deq__11+deq__12+deq__13+deq__14+deq__15+deq__16'
*
.SUBCKT XTEQBUFF4X CSBIAS IN IP ON OP pdb
MN    DPCS    CSBIAS   N4      VSS NCH L=0.13 W=16 M=64
M0    ON      IP       DPCS    VSS NCH L=0.13 W=12 M=4
M1    OP      IN       DPCS    VSS NCH L=0.13 W=12 M=4
RP1   ON      N08      61                                  ◄  pre driver differential circuit
MP    N10     pdb      Vdd     Vdd PCH L=0.13 W=8 M=80
RP2   OP      N08      61
M2    N4      CSBIAS   VSS     VSS NCH L=0.13 W=16 M=64
RP3   N08     N10      27
.ENDS
*
.SUBCKT XTEQBUFF2X CSBIAS IN IP ON OP pdb
MN    DPCS    CSBIAS   N4      VSS NCH L=0.13 W=8 M=64
M0    ON      IP       DPCS    VSS NCH L=0.13 W=6 M=4
M1    OP      IN       DPCS    VSS NCH L=0.13 W=6 M=4      ◄  pre driver differential circuit
RP1   ON      N08      122
MP    N10     pdb      Vdd     Vdd PCH L=0.13 W=4 M=80
RP2   OP      N08      122
M2    N4      CSBIAS   VSS     VSS NCH L=0.13 W=8 M=64
RP3   N08     N10      54
.ENDS
*
.SUBCKT XTEQBUFF CSBIAS IN IP ON OP pdb
MN    DPCS    CSBIAS   N4      VSS NCH L=0.13 W=8 N=32
M0    ON      IP       DPCS    VSS NCH L=0.13 W=6 M=2
M1    OP      IN       DPCS    VSS NCH L=0.13 W=6 M=2
RP1   ON      N08      244                                 ◄  pre driver selection
MP    N10     pdb      Vdd     Vdd PCH L=0.13 W=4 M=40
RP2   OP      N08      244
M2    N6      CSBIAS   VSS     VSS NCH L=0.13 W=8 M=32
RP3 N08 N10   108
.ends
*
.SUBCKT XTEQBUFFx CSBIAS IN IP ON OP pdb
MN    DPCS    CSBIAS   N6      VSS NCH L=0.13 W=8 M=4
M0    ON      IP       DPCS    VSS NCH L=0.13 W=1.5 M=1
M1    OP      IN       DPCS    VSS NCH L=0.13 W=1.5 M=1    ◄  pre driver selection
RP1   ON      N08      1952
MP    N10     pdb      Vdd     Vdd PCH L=0.13 W=4 M=10
RP2   OP      N08      1952
M2    N6      CSBIAS   VSS     VSS NCH L=0.13 W=8 M=4
RP3   N08     N10      864
.ends
*
.subckt inv out in pl=0.13 pw=0.3 nl=0.13 nw=0.3
mn0 out in vss vss nch w=nw l=nl
mp0 vdd in out vdd pch w=pw l=pl
.ends inv
*
.inc './inc/c14__1.2v__1111.tt'        ◄  IDT generic (encrypted) device models
*
.protect
*.lib './inc/fets.lib' tt               ◄  TSMC (encrypted) device models
*.lib './inc/resistor.lib' tt
.unprotect
*************************************
*.inc './inc/polyres__encrypt.inc'
*************************************
*   Channel between txn,txp and rxxn,rxxp
*************************************
.inc './inc/Transmission__lines.inc'   ◄  Board Models
.model spkg__t s tstonefile='./inc/Pkg__transmit__2pairs.s8p'
.model spkg__r s tstonefile='./inc/Pkg__receive__2pairs.s8p'
.model svia s tstonefile='./inc/10__layer__via__top__bottom.s2p'
*
cpkg1 txn 0 1pf
cpkg2 txp 0 1pf
*
rpkg1 txn txn__r 0.1
rpkg2 txp txp__r 0.1
*
rpullupp vdd txp2 50
rpullupn vdd txn2 50
*
```

```
****************************
*   S-parameter package model
****************************
s1 txp_r txn_r txn2 txp2 tn_pkg tp_pkg tp2_pkg tn2_pkg vss mname=spkg_t
*
********************
*   Decoupling Caps
********************
ccoupl_p    tp_pkg rp_cp 75n
ccoupl_n    tn_pkg rn_cp 75n
*
ccoupl_p2   tp2_pkg rp2_cp 75n
ccoupl_n2   tn2_pkg rn2_cp 75n
*
xch1    rp_cp rp_pkg rn_cp rn_pkg stripline
xch2    rp2_cp rp2_pkg rn2_cp rn2_pkg stripline
*
crp_pkg rp_pkg 0 10ff
crn_pkg rn_pkg 0 10ff
ctp_pkg tp_pkg 0 10ff
ctn_pkg tn_pkg 0 10ff
crp2_pkg rp2_pkg 0 10ff
crn2_pkg rn2_pkg 0 10ff
*
****************************
*   S-parameter package model
****************************
s2 rxp rxn rxn2 rxp2 rn2_pkg rp2_pkg rp_pkg rn_pkg vss mname=spkg_r
********************
*   Ideal terminations
********************
clrp rxp 0 550f
clrn rxn 0 550f
clrxp2 rxp2 0 550f
clrxn2 rxn2 0 550f
*
rp rp_pkg com 50
rn rn_pkg com 50
vcom com    0v   0.5v
********************
*   Initial conditions
********************
.ic v(txp)=1.0v
.ic v(txn)=1.0v
****************************
****************************
*   Measurement
****************************
*.probe dif_tv = par('v(txp)-v(txn)')
*.probe dif_rv = par('v(rxp)-v(rxn)')
*.probe dif_rv2 = par('v(rxp2)-v(rxn2)')
.print   v(rxn2)   v(rxp2)   v(txn2)   v(txp2)
****************************
*   Analysis
****************************
.options scale=1E-6
.option post
.op
.tran 1p 10n
```

What is claimed is:

1. A method of modeling an output driver circuit, comprising:

physically measuring at least one characteristic of the actual output driver circuit; and using the at least one characteristic to determine at least one parameter in a behavioral model in order to predict a behavior of the output driver circuit, the behavioral model based on a circuit comprising at least one output driver circuit having a differential amplifier including a first current source having a first current value and an emphasis driver including a second current source having a second current value;

calibrating the first and second current values with accepted values;

using the behavioral model to design target integrated circuits having at least one output driver circuit;

wherein the modeling includes:

modeling a voltage controlled voltage source section;

modeling a capacitively loaded inverter section coupled to receive signals from the voltage controlled voltage source section;

modeling a differential pre-amplifier section coupled to receive signals from the capacitively loaded inverter section;

modeling a main differential driver coupled to receive signals from the differential preamplifier section; and modeling an emphasis driver coupled to receive signals from the differential pre-amplifier section and the main differential driver, wherein the at least one parameter determines a characteristic of the behavioral model.

2. The method of claim 1, wherein the at least one characteristic of the output driver circuit is a resistance of a pull-up resistor and the at least one parameter is resistance of the pull-up resistor.

3. The method of claim 1, wherein the at least one characteristic of the output driver circuit includes an output driver current of an output driver circuit current source and the at least one parameter is the current of the current source.

4. The method of claim 1, wherein the at least one characteristic of the output driver circuit includes overshoots and undershoots in an output waveform and the at least one parameter includes transistor values fit to the measured overshoots and undershoots in the output waveform.

5. The method of claim 1, wherein the at least one characteristic of the output driver circuit is an output waveform under a set load.

6. The method of claim 5, wherein the at least one parameter is a clamping voltage.

7. The method of claim 5, wherein the at least one parameter is a transistor strength.

* * * * *